United States Patent [19]

Sager

[11] Patent Number: 5,761,782

[45] Date of Patent: Jun. 9, 1998

[54] METHOD OF FABRICATION OF PIEZOELECTRIC BENDER ELEMENTS

[75] Inventor: Frank Everett Sager, Clear Lake Shores, Tex.

[73] Assignee: Oceaneering International, Inc., Houston, Tex.

[21] Appl. No.: 801,621

[22] Filed: Feb. 18, 1997

Related U.S. Application Data

[63] Continuation-in-part of Ser. No. 573,202, Dec. 15, 1995, abandoned, which is a continuation-in-part of Ser. No. 297,233, Aug. 29, 1994, abandoned.

[51] Int. Cl.$^6$ ........................................... H01L 41/22
[52] U.S. Cl. ........................... 29/25.35; 310/328; 310/330
[58] Field of Search ....................... 29/25.35; 310/324, 310/328, 330–332

[56] References Cited

U.S. PATENT DOCUMENTS

| | | | |
|---|---|---|---|
| 3,946,398 | 3/1976 | Kyser et al. | 310/328 |
| 4,011,474 | 3/1977 | O'Neill | 310/328 |
| 4,140,936 | 2/1979 | Bullock | 310/328 |
| 4,162,511 | 7/1979 | Toda et al. | 358/128 |
| 4,164,756 | 8/1979 | Toda et al. | 358/128 |
| 4,176,378 | 11/1979 | Toda et al. | 358/128 |
| 4,234,245 | 11/1980 | Toda et al. | 350/269 |
| 4,342,936 | 8/1982 | Marcus et al. | 310/330 |
| 4,351,192 | 9/1982 | Toda et al. | 73/861.18 |
| 4,405,402 | 9/1983 | Quilliam | 156/273 |
| 4,417,169 | 11/1983 | Toda et al. | 310/317 |
| 4,545,553 | 10/1985 | Finke et al. | 310/324 |
| 4,620,124 | 10/1986 | Farrau et al. | 310/332 |
| 4,670,074 | 6/1987 | Bressoux et al. | 156/198 |
| 4,708,600 | 11/1987 | Abujudom, II et al. | 417/322 |
| 4,939,405 | 7/1990 | Okuyama et al. | 310/330 |
| 5,113,566 | 5/1992 | Weekamp et al. | 29/25.35 |
| 5,245,242 | 9/1993 | Hall | 310/316 |
| 5,286,199 | 2/1994 | Kipke | 310/311 |
| 5,410,207 | 4/1995 | Miura et al. | 310/328 |
| 5,440,194 | 8/1995 | Beurrier | 310/328 |

FOREIGN PATENT DOCUMENTS

| | | | |
|---|---|---|---|
| 3833109 | 4/1990 | Germany | 310/328 |
| 2484900 | 4/1975 | U.S.S.R. | 310/318 |
| 2087659 | 5/1982 | United Kingdom | 310/328 |

OTHER PUBLICATIONS

Toda et al. "Application of PVF$_2$ Bimorph Cantilever Elements to Display Devices", Proceeding of S.I.D., vol. 19/2 Second Quarter 1928, pp. 35–41.

Toda et al. "Electromotional Devices Using PVF$_2$ Multilayer Bimorph" Transactions of IECE of Japan, vol. E61. No. 7 Jul. 1978, pp. 507–512.

Toda "Theory of Air Flow Generation by a Resonant Type PVF$_2$ Cantilever Vibrator," Piezoelectrics, 1979, vol. 22, pp. 911–918.

Toda, "Voltage Induced Large Amplitude Bending Device–PVF$_2$ Bimorph Its Properties and Application," Piezoelectrics, 1981, vol. 32, pp. 127–133.

Nevil et al. "The Potential of Corrugated PVDF Bimorphs for Actuation and Sensing" SME Conference, Robotics Research, The Next Five Years and Beyond Aug. 14–16, 1984 Technical Paper MS84–491.

1st page of Memorandum of Agreement obtained Mar. 5, 1996.

*Primary Examiner*—Carl E. Hall
*Attorney, Agent, or Firm*—Kurt S. Myers

[57] ABSTRACT

A method of fabrication of piezoelectric bender-elements. More specifically, the fabrication method of the present invention uses pressure and temperature, without any adhesive, to bond and anneal a plurality of layers of piezoelectric polymer film into piezoelectric bender-elements.

14 Claims, 15 Drawing Sheets

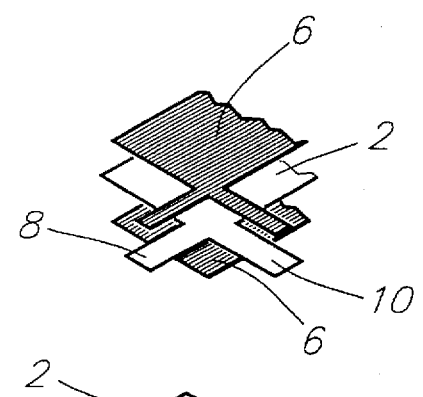
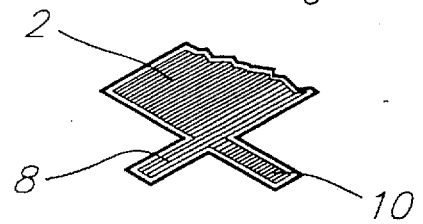
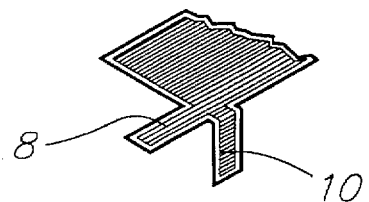
FIG. 1 (a)
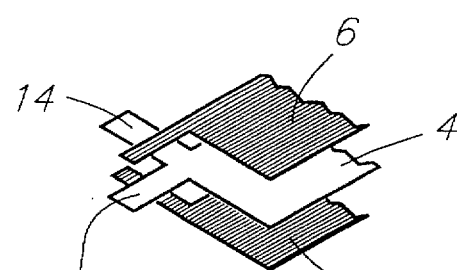
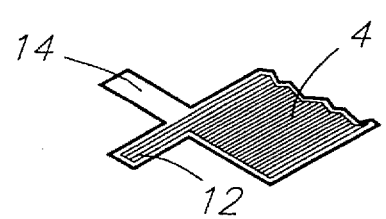
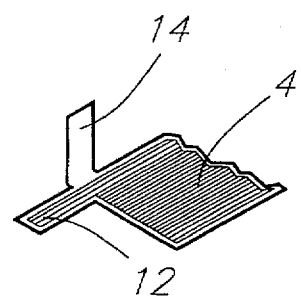
FIG. 1 (b)

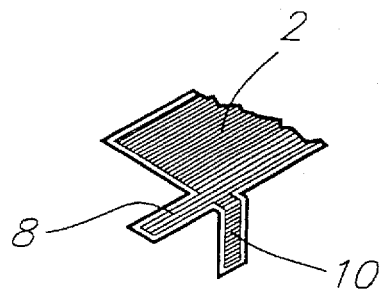
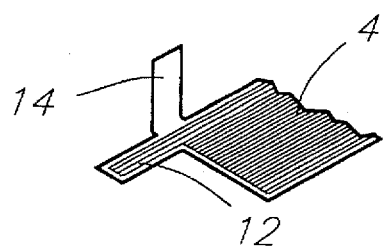
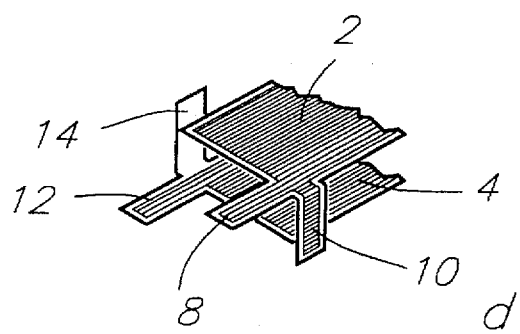
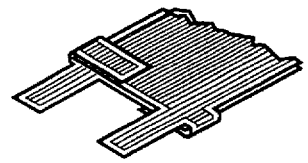
FIG. 1 (c)
FIG. 1 (d)

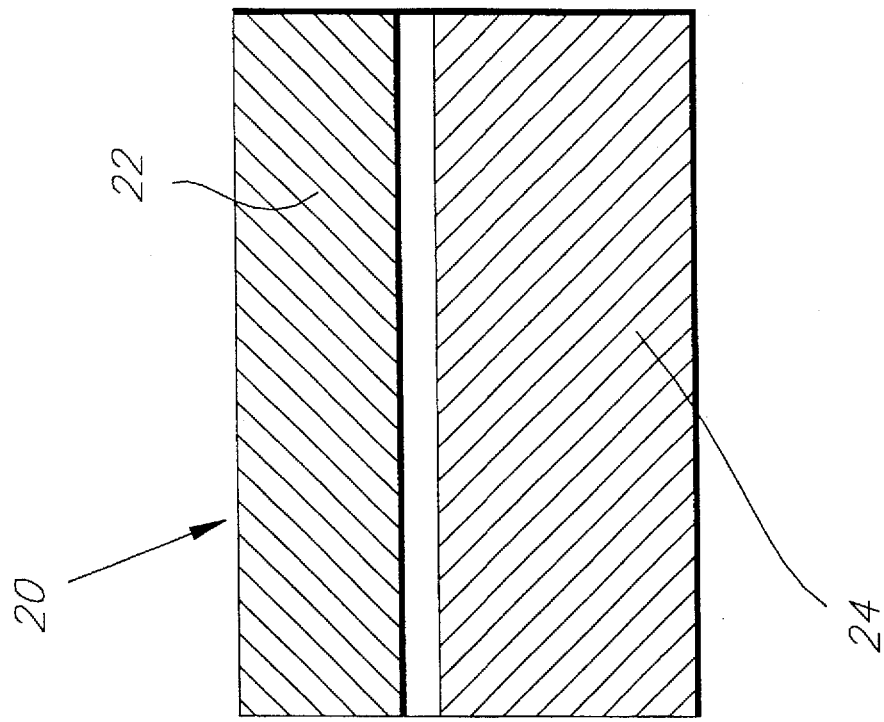
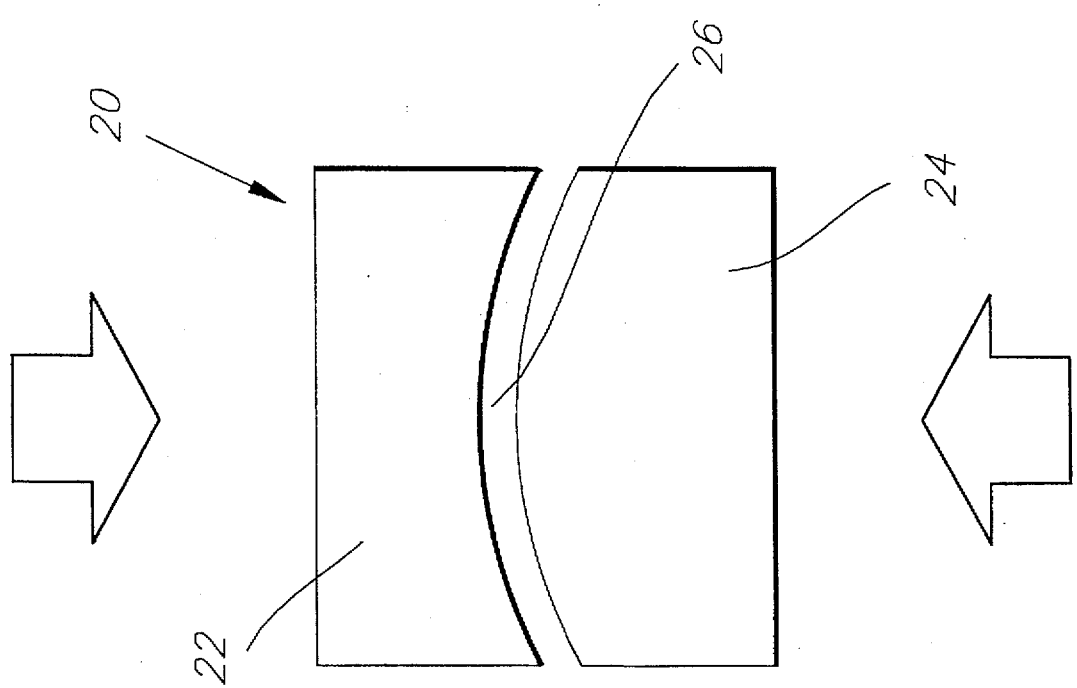
FIG. 3

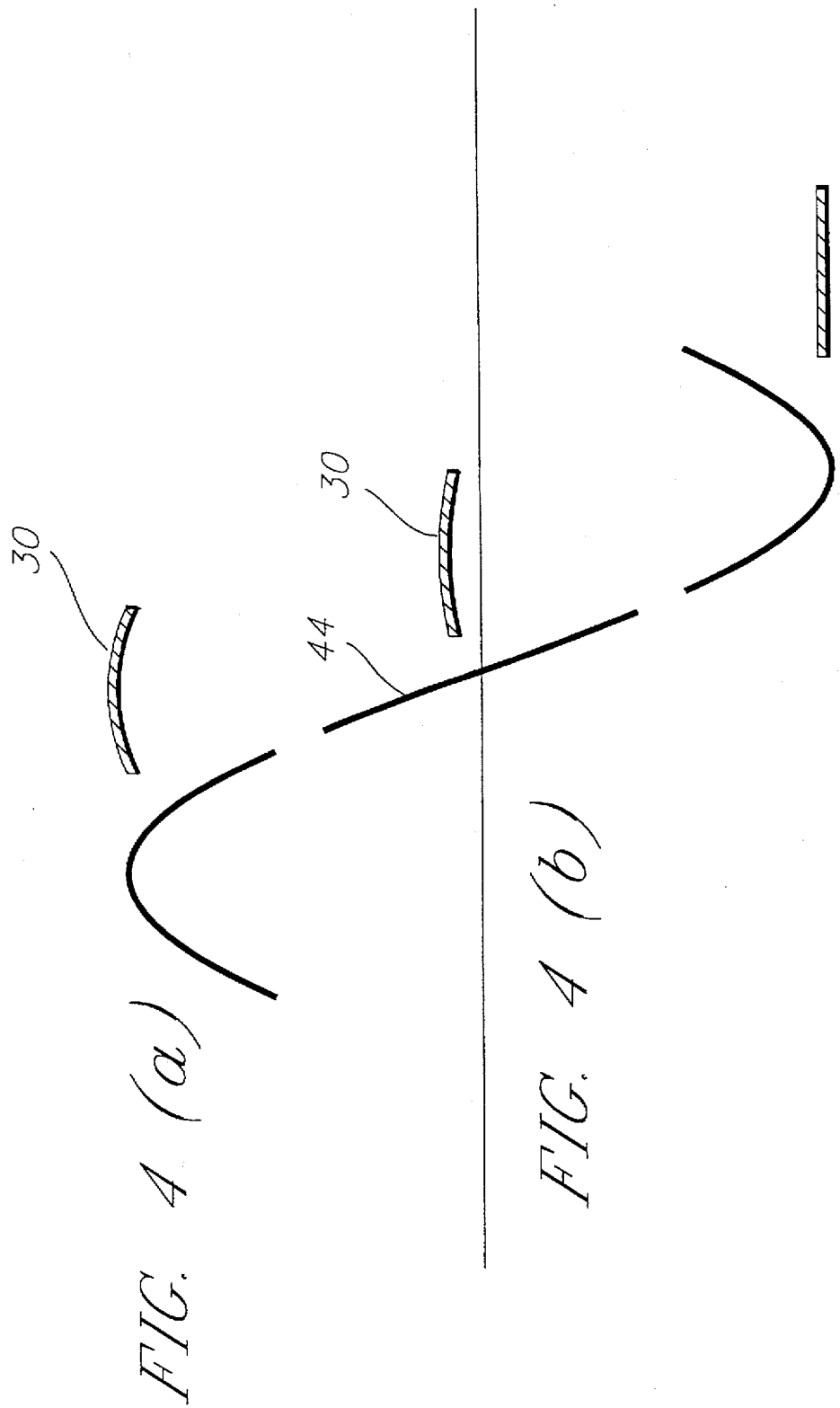

METHOD OF FABRICATION OF PIEZOELECTRIC BENDER ELEMENTS

RELATED APPLICATION

This application is a continuation-in-part application of U.S. patent application Ser. No. 08/573,202, filed Dec. 15, 1995, entitled "PIEZOELECTRIC ELECTROMOTIONAL DEVICE", now abandoned, which is in turn a continuation-in-part application of U.S. patent application Ser. No. 08/297,233, filed Aug. 29, 1994, entitled "PIEZOELECTRIC PUMP", now abandoned.

FIELD OF INVENTION

The present invention is directed to the method of fabrication of piezoelectric bender-elements. More specifically, piezoelectric bender-elements are fabricated using multi-layers of piezoelectric material by bonding the layers in a press and heating the layers to form a bender element with a mechanical bias or curve.

BACKGROUND OF THE INVENTION

Piezoelectric materials have been used extensively as sensors and acoustical/electric coupling devices. Materials that have been used in these devices are made from films of polymer such as polyvinylidene fluoride (PVDF) which are drawn or stretched while subjecting the polymer film to an electric field. The piezoelectric film will then respond to applied electrical fields by either lengthening or shortening depending upon the direction of the applied field. The deflection which can be obtained using piezoelectric polymer films are substantially greater than those obtained using piezoelectric ceramic crystals.

There are several specific techniques disclosed for making the sensor-elements using piezoelectric films; however, common to those folding the piezoelectric polymer film in multi-layers is the use of an epoxy resin or a glue as an adhesive between film layers. Papers disclosing making sensors using bimorph elements and specific techniques in making the elements are: "Application of PVF$_2$ Bimorph Cantilever Elements to Display Devices", M. Toda and S. Osaka, Proceeding of the S.I.D., Vol 19/2, Second Quarter 1978, pp 35–41; "Electro-motional Device Using PVF$_2$ Multilayer Bimorph", M. Toda and S. Osaka, Transactions of the IECE of Japan, Vol E61 No 7, Jul. 1978, pp 507–512; "Theory of Air Flow Generation By a Resonant Type PVF$_2$ Bimorph Cantilever Vibrator", M. Toda, Piezoelectrics, 1979, Vol 22, pp 911–918; "Voltage-Induced Large Amplitude Bending Device—PVF$_2$ Bimorph—Its Properties and Applications", M. Toda, Piezoelectrics, 1981, Vol 32, pp127–133; and "The Potential of Corrugated PVDF Bimorphs for Actuation and Sensing", Gale E. Nevil, Jr. and Alan F. Davis, SME Conference—Robotics Research: The Next Five Years and Beyond, Aug. 14–16, 1984, Technical Paper MS84–491. When multi-layer piezoelectric polymer film elements were made "the films were bounded together using epoxi-resin (High Super, Cemedine Corp.)" {"Electromotional Devices Using PVF$_2$ Multilayer Bimorph", sic. p 509}.

The following patents are all patents of Toda et al. which disclose bimorph elements of piezoelectric materials. U.S. Pat. No. 4,162,511 discloses a pickup cartridge for use in a velocity correction system which includes a polymer bimorph element mechanically interposed between a cartridge housing and a pickup arm carrying a groove-riding stylus. U.S. Pat. No. 4,164,756 discloses a signal pickup stylus which cooperates with an information storing spiral groove on a video disc record which is caused to selectively skip groove convolutions of the disc record to produce special effects. U.S. Pat. No. 4,176 378 discloses a pickup arm pivotally coupled to a housing support at one end thereof and which is coupled to the housing near its other end by means of bimorph elements attached together at right angles. U.S. Pat. No. 4,234,245 discloses a light control device which includes a bimorph element comprising two thin polyvinylidene fluoride films and a thin layer disposed therebetween to secure the films together. U.S. Pat. No. 4,351,192 discloses a piezoelectric, acoustic vibration detecting element which is positioned in a fluid flow to be measured so as to be moved according to the intensity of the fluid flow away from a source of acoustic vibration. U.S. Pat. No. 4,417,169 discloses a photoelectric circuit arrangement for driving a piezoelectric bimorph element to bend and thereby to open or close a window blind according to the quantity of transmitted light through the blind.

U.S. Pat. No. 4,342,936 discloses a piezoelectric flexure mode device (called a "unimorph") comprising a layer of piezoelectric active material bonded to a layer of piezoelectric inactive material.

U.S. Pat. No. 4,405,402 discloses a thick piezoelectric/pyroelectric element made from polarized plastics such as polyvinylidene fluoride.

U.S. Pat. No. 4,670,074 discloses a composite co-laminated piezoelectric transducer with at least one layer of polymeric substance capable of acquiring piezoelectric properties when co-laminated in the presence of an electric field.

U.S. Pat. No. 4,708,600 discloses a piezoelectric fluid pumping apparatus which includes a pumping apparatus incorporating a piezoelectric energizer.

U.S. Pat. No. 4,939,405 discloses a pump comprised of a piezoelectric vibrator mounted in a casing.

U.S. Pat. No. 5,113,566 discloses a method of producing a multilayer piezoelectric element.

SUMMARY OF THE INVENTION

The present invention is directed to a method of fabrication of piezoelectric bender-elements. More specifically, the fabrication method of the present invention uses pressure and temperature, without any adhesive, to bond and anneal a plurality of layers of piezoelectric polymer film into piezoelectric bender-elements.

BRIEF DESCRIPTION OF THE DRAWINGS

FIG. 1 is a schematic series of views (a; b; c; and d) illustrating the fabrication of a bender-element using two strips of polyvinylidene fluoride having a thin layer of silver electrode coating on each side (the film being cut with tabs and the coating being the shaded layers applied to top and bottom), the polarity of the top film of polyvinylidene fluoride being in opposite direction than that of the bottom film of polyvinylidene fluoride; specifically, FIG. 1 (a) is one strip of film having only the top of the tabs coated and one tab folded; FIG. 1 (b) is a second strip of film having the top of one tab and the bottom of the other tab coated and one tab folded; FIG. 1 (c) shows placing the two films together; and FIG. 1 (d) showing the two film connected;

FIG. 2 (b) shows the geometry of the strips and the polarity-machine orientation; and FIG. 2 (c) illustrates the folding of the films to form a bender-element of the present invention;

FIG. 3 is a cross-sectional and end view of a press with jaws having a size and shape to bond a bender-element with a desired radius of curvature;

FIG. 4 is a schematic illustrating the sine curve of an alternating electric field changing the polarity placed on a unit cell and the corresponding deflection changes of the unit cell; specifically, FIG. 4 (a) illustrates the deflection of the unit cell at one extreme of polarity; FIG. 4 (b) illustrates the unit cell with no deflection due to polarity; and FIG. 4 (c) illustrates the deflection of the unit cell at the other extreme of polarity;

BRIEF DESCRIPTION OF THE PREFERRED EMBODIMENTS

Figure 2C:
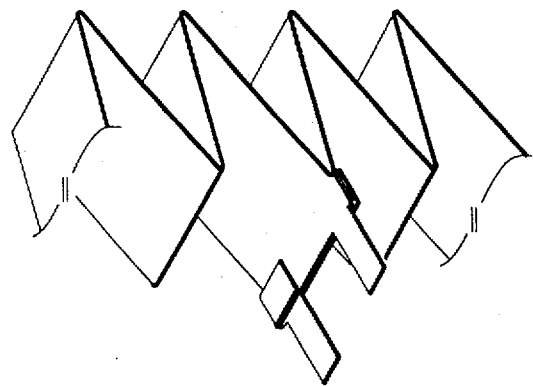
FIG. 2 is a schematic series of views illustrating the folding of the two strips of piezoelectric multimorph film before bonding or laminating the strips; specifically, FIG. 2 (a) shows that two films are connected as fully shown in FIG. 1.

The fabrication of the bender-element and the piezoelectric unit cell are unique and provide the basis of the piezoelectric devices of the present invention. Heretofore, piezoelectric elements have principally been used as sensors and the deflection movement of the element has been the major consideration. Thus, mechanical integrity was a minor part of the element. The fabrication of any multiple layer piezoelectric bender element heretofore has employed an epoxy resin or some other adhesive to bind the layers. On the other hand, the piezoelectric bender-elements and more specifically the piezoelectric unit cells of the present invention are used as driving blocks or force sources which may be used in many applications such as a piezoelectric pump.

Heretofore, a plurality of piezoelectric elements, all working as a single unit, have been used to increase the force of the deflection but while the addition of additional layers of elements increases the force, the plurality of layers or elements decreases the deflection. To overcome this dilemma, the present invention uses mechanically biased piezoelectric bender-elements (meaning that the bender-elements are curved in their fabrication). Two of these mechanically biased piezoelectric bender-elements are then fabricated into a unit cell wherein the two bender-elements are both mechanically and electrically biased in opposite directions. This basic structure of the unit cell as compared to a single piezoelectric element has at least four times the deflection for a given drive voltage. In addition, by using multi-layered bender-elements in the unit cell of the present invention, the force can be multiplied while retaining the maximum deflection possible for a given drive voltage.

The bender-elements of the present invention are fabricated using multilayered films of a piezoelectric material such as a film of polyvinylidene fluoride. A piezoelectric film has the property that when the film is subjected to an electric field the film either lengthens or shortens depending upon the direction or polarity of the applied electrical field. A film of poly-vinylidene fluoride is made piezoelectric by drawing or stretching the film while subjecting the film to an electric field. In order to increase the deflection for a given drive voltage from that of a single film layer of polyvinylidene fluoride, a two layer or bimorph bender-element is fabricated with the layers arranged so that one layer lengthens while the other layer contracts. Since both layers are bonded together, the bimorph bends in a fashion similar to a bimetallic thermostat element. In order to increase force and preserve deflection for a given drive voltage from that of a bimorph, a multilayer or multimorph bender-element is fabricated. To produce a multimorph bender-element of the present invention, the fabrication method is done without the use of an epoxy or glue adhesive. The electrode coating may be a highly conductive metal, such as silver or a metal such as platinum, gold, copper or any combination of conductive material. Piezoelectric polyvinylidene fluoride films are the preferred materials used in the fabrication of the multimorph bender-elements. Such films are available from Amp Incorporated in film thicknesses which range from 9 microns to 600 microns and are available with a silver coating.

The fabrication method of the present invention involves the steps of bonding by heating while under pressure the layers of piezoelectric material and then annealing to form the bender-elements of the present invention. The layers of piezoelectric material are placed in a curved press so that the bender-elements are fabricated with a mechanical bias or a natural curve.

A preferred embodiment of the present invention involves the folding of the electrode coated piezoelectric polymer films and is unique to the present invention. The cutting of the film and the presence or non-presence of the electrode coating on certain portions of the cut film is shown in FIG. 1. A first strip 2 of polyvinylidene fluoride is shown in FIG. 1(a) and a second strip 4 of polyvinylidene fluoride is shown in FIG. 1(b). Each strip 2 and 4 have a thin layer of silver electrode coating 6 (cross hatching) applied to each side of the strips 2 and 4 in preparation to fabricate a multimorph bender-element of the present invention. As shown in FIG.

1(a), the first strip 2 has two tabs 8 and 10 extending from the strip 2; however, only the top of tabs 8 and 10 are coated with the silver coating 6 and neither of the bottom surfaces of tabs 8 and 10 have any silver electrode coating 6. The tab 10 when fabricating the bender-element of the present invention is folded or bent downward as shown in the bottom figure of FIG. 1(a). The strip 4 on the other hand has two tabs 12 and 14 which are positioned opposite that of the tabs 8 and 10 of strip 2 as shown in FIG. 1(a). The top surface of tab 12 and the bottom surface of tab 14 have a thin layer of the silver electrode coating; whereas, neither the bottom surface of tab 12 or the top surface of tab 14 have any silver electrode coating as shown in the upper figure of FIG. 1(b). The tab 14 when fabricating the bender-element of the present invention is folded or bent upward as shown in the lower figure of FIG. 1(b). The two strips 2 and 4 are then placed one on top of the other as shown in FIG. 1(c). The tabs 8 and 12 extend from the end of the two strips and the electric wires or connections from an electrical circuit are connected to each of these tabs 8 and 12. The tabs 10 and 14 on the other hand are folded to provide electrical contact with the reverse side of the respective strip as shown in FIG. 1(d). Sheets of piezoelectric film are available with an electrode coating already applied to both surfaces of the film. It is preferred that the electrode coating be removed at the edges of strips 2 and 4 as well as removing the coating from the tabs as indicated when cutting the strips from already coated polyvinylidene fluoride or $PVF_2$ strips. Removing the conductive silver electrode material from the edges prevents high voltage arcing.

Figure 2B:
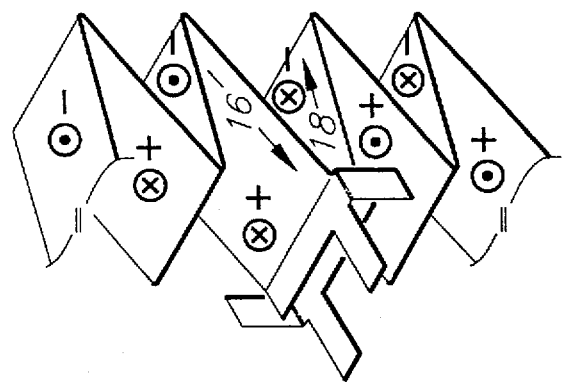
Figure 2A:
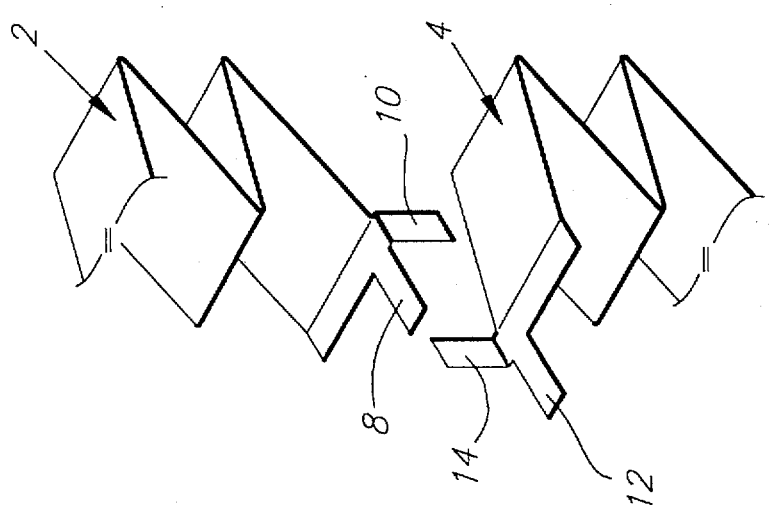

The first step in fabricating the bender-elements of the preferred embodiment of the present invention is to fold at least two strips 2 and 4 of the film as illustrated in FIG. 1. The strips 2 and 4 of coated film are folded as shown in FIG. 2. The first strip 2 is folded into layers (2 shown and can extend to any number desired) to produce a multi-layered bender-element. The polarity-machine orientation of the strip 2 of piezoelectric film is opposite that of the strip 4 of piezoelectric film when a voltage is applied to the films or the polarity directions of the film are opposite. What opposite polarity-machine orientation means is that when an applied voltage is applied to the films, the field voltage is in a direction which is the same as the polymer orientation and the one film will expand while the field voltage is opposite the polymer orientation and the other film will contract. The arrow 16 shows the polarity-machine orientation or polarity of the strip 2. The second strip 4 is folded into the same length and same number of layers as strip 2 but the polarity of the film, as shown by the arrow 18, is in the other direction. In other words the polarity-machine orientation of the second strip 4 is 180° from the first strip 2 and therefore one film will expand while the other will contract. At this point, it is pointed out that polarity will be discussed in two ways in the understanding of the present invention: (1) the applied voltage polarity which is a function of the electrical circuit connected to the strips and (2) the inherent polarity or polymer orientation of the strips 2 and 4 which is the function of the machine direction of the respective strip (indicated by an x or . in a circle and a machine direction away from the tabs). Thus, when the voltage polarity is reversed on the tabs 8 and 12, it reverses the polarity-machine orientation of the films such that the film that expanded will contract and the film that contracted will expand.

The uniqueness of the tabs 8, 10, 12 and 14 is that they provide the continuity of applied polarity to the multimorph or folded structure shown in FIG. 2 through a single set of leads attached to tab 8 and tab 12. Thus, from a single pair of electrical leads one of positive polarity and the other negative, the tabs provide opposite polarities to the electrode film surfaces of the two strips 2 and 4. For example, assuming that the polarity to tab 8 is positive and thus the top surface of strip 2 is positive, tab 10 provides the same polarity to the bottom surface of strip 4 when that strip is folded back over the tab 10 as shown in FIG. 2. Assuming tab 8 is positive then tab 12 is negative and the same negative polarity is on the top surface of strip 4 and the bottom surface of strip 2 and that polarity continues however many number of layers the strips are folded. The tab 14 is redundant as to requiring this tab to provide the same polarity from the bottom surface of strip 4 to the top surface of strip 2; however, the two tabs 10 and 14 provide a greater surface area for the flow of electrons to provide the same polarity to these two surfaces. A restricted path for the flow of electrons may cause a hot spot or short. The uniqueness of the tabs and the folding is that only two leads are required.

A multi-layer bender-element may be made without all the a specifics of the preferred embodiment. For example, the piezoelectric material need not be solely strips of polyvinylidene fluoride film coated with silver as the electrode coating. To make the multi-layer bender-element of the the present invention the orientation of the layers of electrode coated piezoelectric material need to be the same as a single folded film. In other words, if the piezoelectric material has a polarity-machine orientation, the respective layers will have the same orientation as a single folded film. Or stated still in another way, the respective layers of material can not be simply randomly stacked. As an alternative to tabs, the discontinuous piezoelectric film or material may have small opening extending though the layers of piezoelectric material for electron flow.

Referring now to FIG. 3, to laminate the strips of film, the folded strips 2 and 4 of film are positioned into a press 20 having an upper jaw 22 and lower jaw 24, preferably each jaw made of machined pieces of polycarbonate. A preferred set of jaws 22 and 24 have a slight radius of curvature or curved portion 26 to fabricate the bender-elements with a mechanical curvature or bias. The two folded strips 2 and 4, as shown in FIG. 2(c), are positioned between upper jaw 22 and lower jaw 24. The jaws 22 and 24 of the press 20 are closed and as much pressure as required is applied to the two separate folded films. The pressure may range from 100 pounds per square inch (psi) to 10,000 psi. The press 20 and the compressed films are then subjected to a heating cycle to bond the films, such as placing the compressed films into a low temperature oven. The temperature of the oven may range from 35° C. (950° F.) to 650° C.(1490° F.). At the higher temperatures the compressed films in press 20 are left in the oven for a shorter time, approximately a half hour, while at the lowest temperatures the press 20 will be kept in the oven for as long as 12 hours. The press 20 is then removed from the oven and without removing the compression on the films, is air cooled to room temperature.

The bonded and annealed films are removed from the vice as a multi-layered bender-element 30 having a desired mechanical bias or curved shape. After removing the bender-element 30 from the vice 20, the continuity of the multimorph bender-element is tested. A simple test is to apply an electrical field and if the multi-layered or multimorph bender-element expands or contracts then the bender-element has the desired electrical continuity. As shown in FIG. 4, the natural state of the bonded bender-element 30 is that of FIG. 4(b), i.e. having a curvature or mechanical bias such as shown. When the polarity is in one direction, the bender-element as shown in FIG. 4(a) is in the expanded state and when the polarity is reversed, the bender-element as shown in FIG. 4(c) is in the contracted state. The multi-layered bender-element 30 from an electrical viewpoint acts as a capacitor and resistor in the electrical circuit.

Figure 5A:
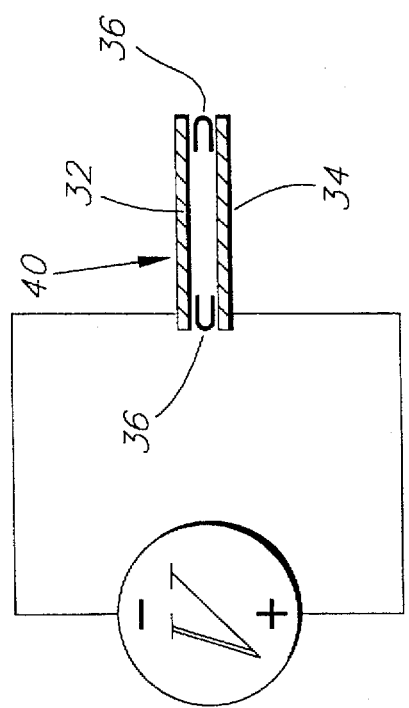
FIG. 5 are schematic views illustrating the piezoelectric unit cell of the present invention; specifically one view, FIG. 5 (a), with an electrical polarity which provides a field across the bender-elements of the unit cell and the unit cell is in the expanded state; the second view, FIG. 5 (b) in which the polarity of the electric field on the unit cell is reversed and the unit cell is in the contracted state.
Figure 5B:
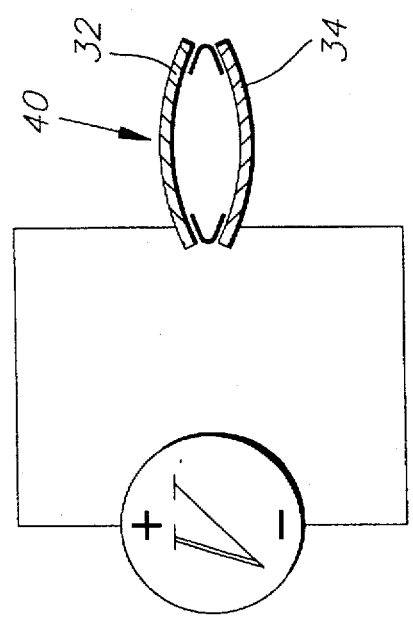

The configuration of a piezoelectric unit cell 40 is illustrated in FIG. 5. In the preferred embodiment, at least two multi-layered bender-elements 30 are placed end-to-end, specifically bender-element 32 and 34, with the ends held together with a compliant hinge 36 and the mechanical bias or curvature of each bender-element is in the opposite direction. The unit cell 40 in which the bender-elements 32 and 34 are in the contracted state is shown in FIG. 5b. It becomes clear that the fabricated bender-elements 30 must have a bias when fabricated to make a unit cell 40 so that when the polarity of the field across each of the bender-elements 30 results in the bender-elements being in their contracted state, the two bender-elements will not come into contact with one another. Stated differently, a unit cell 40 of the present invention has a greater deflection potential than if only one polarity can be placed on bender-elements 30 of a unit cell 40. FIG. 5(a) illustrates the unit cells 40 with an opposite field polarity across bender-element 32 and bender-element 34. The advantage of having two biased or curved bender-elements is that when subjected to an electrical field the unit cell 40 has much greater deflection than a single bender-element. When the current applied to the unit cell 40 alternates in polarity, illustrated by the sine wave 42 shown in FIG. 4, or the polarity of the field across the two bender-elements is reversed using the same voltage, the unit cell 40 will expand as shown in FIG. 5(a). It can be seen that when the voltage polarity on the unit cell 40 is reversed from that shown in FIG. 5(a), the unit cell 40 in FIG. 5(b) becomes almost flat, thus obtaining the greatest deflection between the two peaks of the sine wave 42. Without the bias or curvature at the rest position of the bender-elements 32 and 34 which make the unit cell 30, a circuit which reverses the field on the unit cell cannot be used. Therefore, without increasing the magnitude of the voltage used, but reversing the polarity, the deflection of the unit cell 40 can be doubled. This enables the unit cell 40 of the present invention to have a much greater application of uses. This configuration of two bender-elements held together with the mechanical and electrical bias in opposite directions is the prime aspect of the unit cell of the present invention regardless of the construction of the bender-elements whether uni-morph or multi-morph.

The upper bender-element 32 and the lower bender-element 34 of unit cell 40 are held together with a compliant hinge 36 such as a piece of tape. The hinge 36 may be on the inside of the two bender-elements 32 and 34 as shown in FIG. 5 or may be on the outside of the two bender-elements 32 and 34, such as a piece of tape stuck to the upper surface of the top bender-element 32 and to the lower surface of the bottom bender-element 34 or a hinge of comparable design may be used. When an electrical field is placed across the two bender-elements 32 and 34 of the unit cell 40, the bender-elements deflect in the opposite direction. In the same field due to the folding of the strips 2 and 4, the opposite polarity of the strips 2 and 4 of piezoelectric films in the upper bender-element 32 will cause one film to expand while the other film will contract, for example, the uppermost strip of film therein may expand while the lower strip of film in the same bender-element 32 will contract. Likewise, the opposite polarity of the strips of film in the lower bender-element 34 will cause the lowermost strip of film therein to expand while the upper strip of film in the same bender-element 34 will contract. It is noted that by reversing the polarities of the strips of film 2 and 4 in the same bender-element 30 and the manner in which the films are folded that a single polarity field increases the deflection within a single bender-element 30, rather than requiring two fields in the opposite direction across films to obtain the greatest deflection. Further, only a single field is required for the unit cell 40, since the two bender-elements 32 and 34 are electrically in parallel, to obtain the desired maximum deflection of the unit cell 40. Preferably, a piezoelectric unit cell 40 is symmetrical having the same number of folds in each of the bender-elements 30 of the top bender-element 32 and the bottom bender-element 34. However, an asymmetrical unit cell 40 may also be fabricated. The unit cell 40 has an application for any linear motion use.

Figure 6B:
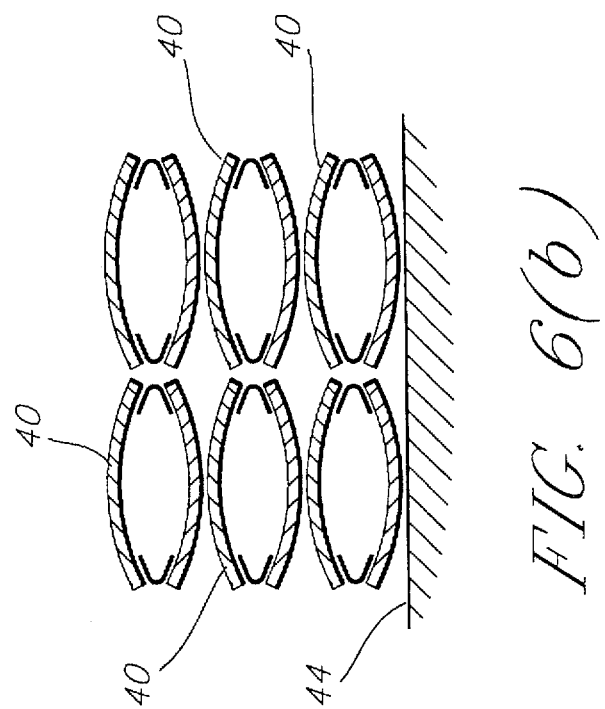
FIG. 6 are schematic views of a stack or plurality of unit cells on a backing plate; specifically one view, FIG. 6 (a), with an initial electrical polarity which contracts the unit cells and the other view, FIG. 6 (b), with an opposite electrical polarity providing a field across the bender-elements which expands the unit cells.
Figure 6A:
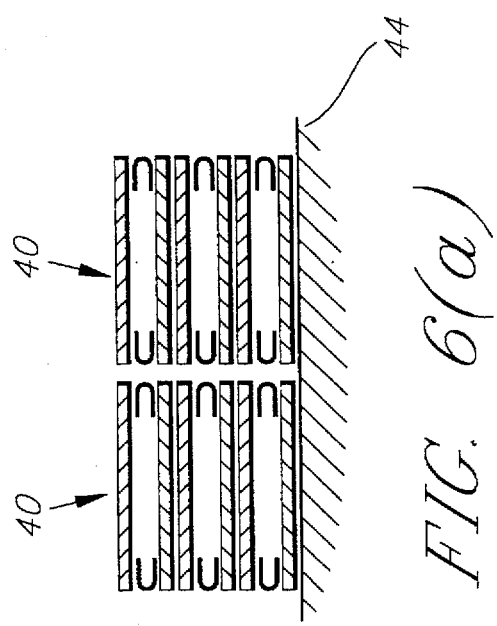

Referring now to FIG. 6, the linear electro-motional application of a unit cell 40 is illustrated. However, instead of using a single unit cell 40, a plurality of unit cells 40 may be stacked one on the other to obtain a greater displacement per unit force when the plurality of cells 40 are subjected to an electrical field and deflection of each unit cell 40 occurs. The unit cells 40 are shown stacked on a backing plate 44. This structure of a plurality of unit cells 40 and a backing plate 44 is basic to many alternatives for the remaining structure to which the unit cells 40 are put to use. For example, when the force of the deflection of the unit cells 40 is desired in a specific direction, the backing plate 44 may represent a fixed structure from which the deflection occurs. On the other hand, the stack of unit cells 40 may have a movable member extending across the top of the stack and the backing plate 44 represents such a member, for example a membrane or a piston actuator which will receive the force of the deflection and move with the upper surface of the top unit cell as the field is applied and removed or the polarity of the field is reversed. Still further, if the stack of unit cells 40 have a fixed upper structure, the deflection will cause a force on the backing plate 44 to move downward and represents the movable structure or the structure against which the force is applied. It is apparent that there are many variations which are readily possible to benefit from the deflection of the stack of unit cells 40 and therefore the force of the plurality of unit cells 40.

Figure 7:
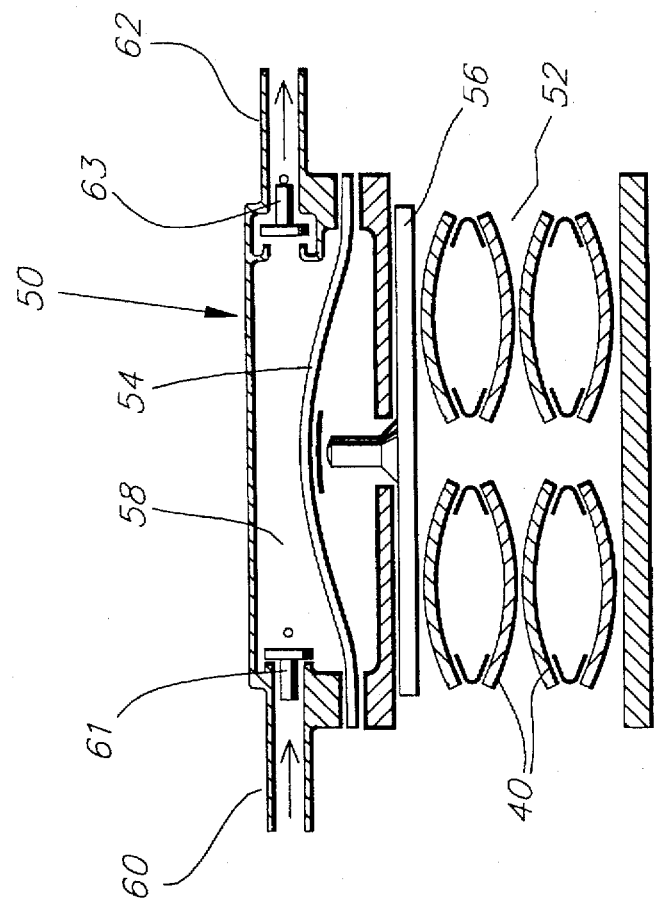
FIG. 7 is a schematic view which illustrates a simple piezoelectric electro-motional device with a plurality of unit cells acting as the drive block for a single chamber pump, the pump in cross-section without the outside housing.

One specific electro-motional embodiment is a piezoelectric pump as shown in FIG. 7. The pump 50 in its simplest form has a housing (not shown) with a drive block chamber 52 containing side-by-side unit cells 40 and preferably a plurality or stack of unit cells 40. At the top of chamber 52 is a diaphragm 54. The unit cells 40 may be in direct contact with the diaphragm 54 or as shown are in contact with a piston 56. An accumulator chamber 58 is at the top portion of the housing of pump 50. A fluid inlet 60 has an inlet check valve 61 for fluid entering the accumulator chamber 58. At the outlet of accumulator chamber 58 is a fluid outlet 62 having an outlet check valve 63. As shown, the unit cells 40 are in their expanded state causing an upward force to be applied to the piston 56 and diaphragm 54 forcing the fluid out of the accumulator chamber 58. When the polarity of the field across the unit cells 40 is reversed, the unit cells 40 contract from the position shown and remove the force on the diaphragm 54 permitting fluid to flow into the chamber 58.

Figure 8:
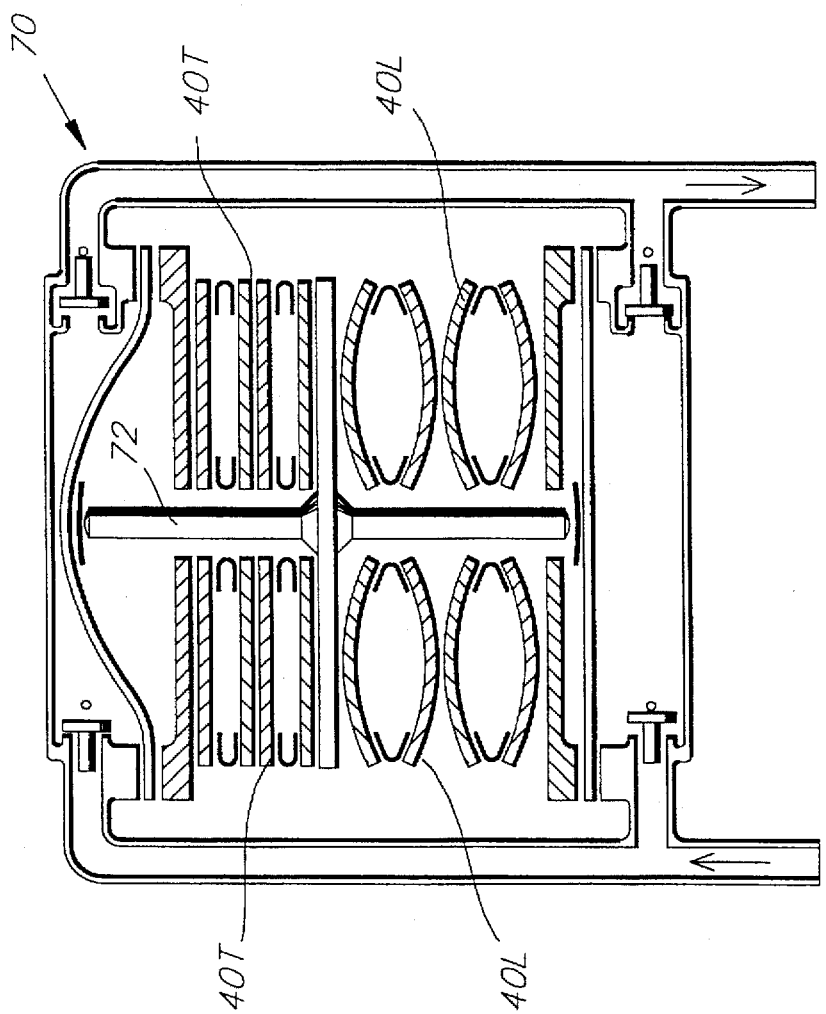
FIG. 8 is a schematic view which illustrates a piezoelectric pump with parallel multi unit cells activating push-pull pistons of a piezoelectric pump with double parallel chambers.

The piezoelectric pumps of the present invention can have a variety of configurations. For example, a multichambered pump with chambers in series or multichambered pump with chambers in parallel or combinations thereof. A multichambered pump 70 is shown in FIG. 8 which operates in the same manner as the single chamber pump except that while fluid enters one chamber the fluid in the other chamber in being forced out. The pump 70 is illustrated as having two chambers and a "push-pull" arrangement of the piezoelectric unit cells which operate on both sides of the drive piston 72. The lower unit cells 40L are driven by the same electronic signal as the top unit cells 40T; however, the polarity of the lower unit cells is opposite that of the upper unit cells.

The advantage is that the entire capacitance of the system, including both upper and lower unit cells is incorporated into the electronic drive circuit. This results in a highly accurate timing system. Another advantage is that as the field polarity is reversed, the contracting unit cells are putting work into the system as well as the expanding unit cells. Depending on the use of the pump, a variety of electric circuits may be used to provide the field to the unit cells 40 (T and L). A direct drive circuit would provide an on-off field to the unit cells. An alternative to using a direct drive circuit is to employ a parallel resonate drive circuit. The parallel resonate circuit, when driven by a sine wave, allows the phase angle between the drive voltage and current to approach 90 degrees. Power is defined as the product of the voltage and the current. When the sine wave phase angle between the voltage and the current approaches 90 degrees, the power required to maintain the oscillation is at a minimum. Application of a parallel resonate circuit reduces the power required to operate the system, and therefore increases system efficiency. This is accomplished using a circuit configuration that takes advantage of the capacitive nature of the unit cells 40 (T and L). The capacitance of the unit cells is used in conjunction with an inductance to produce a tuned LC parallel resonate circuit where the L refers to a measure of inductance and C refers to a measure of capacitance. Preferably the inductance is supplied to the circuit in the form of a step-up transformer. The step-up transformer being required to boost the supply voltage to a range appropriate for driving piezoelectric unit cells. Typically resonant circuits are avoided when building control circuits for piezoelectric films because of the narrow frequency response of the resulting circuit and because most applications of piezoelectric films are as sensors, which generally need to operate over a wide range of frequencies. A resonant circuit is not a problem for mechanical power applications, such as a pump, because the operating frequency of the drive circuit is fixed to optimize the desired mechanical output of the bender-elements. Once the drive frequency is established, the LC circuit can be designed precisely to the mechanical frequency required.

Figure 9:
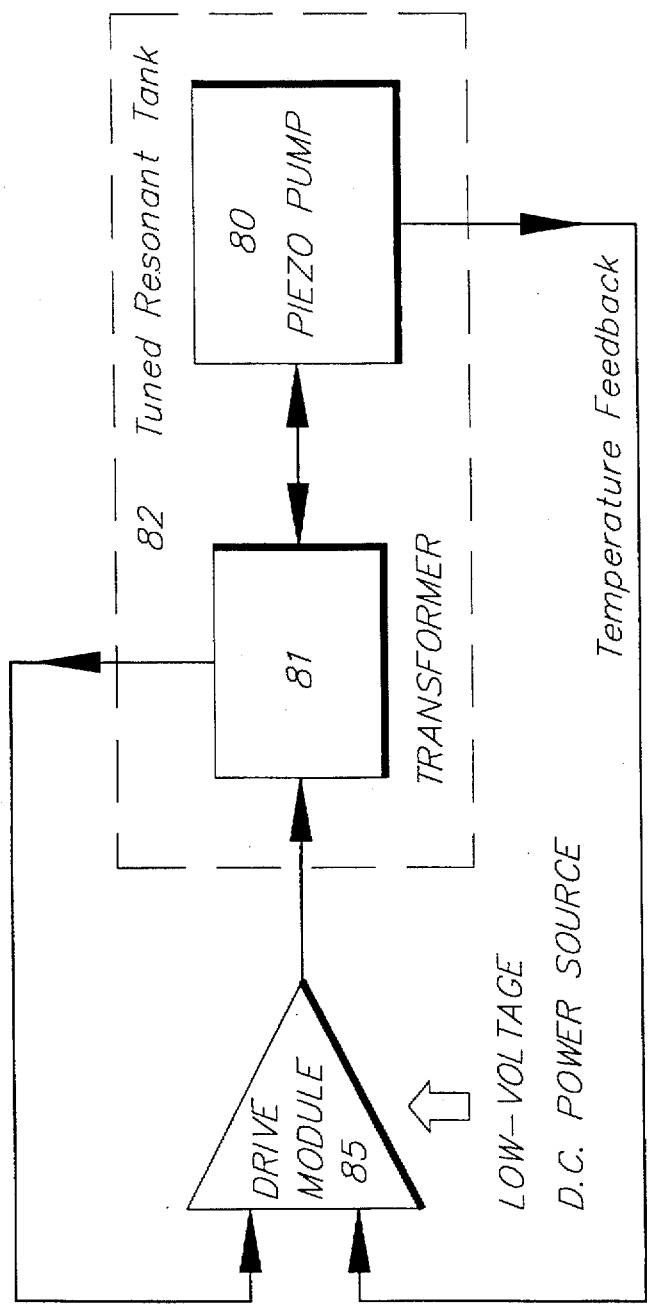
FIG. 9 is a schematic diagram illustrating the electrical circuit to operate the piezoelectric pump.

A piezoelectric pump 80 with an electrical circuit diagram is illustrated in FIG. 9. The electrical diagram shown utilizes the inherent inductance of a transformer 81 as part of the tuned resonant tank 82. This electrical diagram allows the resonant frequency of the tuned resonant tank 82 to be adjusted using a low voltage capacitor in the drive module 83 across the primary of the transformer 81 rather than having to add inductors or high voltage capacitors across the piezoelectric pump 80.

The present invention is more fully set forth and illustrated by the following examples:

EXAMPLE I

A 1.1 mil thick sheet of polyvinylidene fluoride (Amp Incorporated) coated with silver ink is labeled and cut into two strips. The edges of the strips are masked off with 3M soft stick tape and the border of silver ink is removed with methyl-ethyl ketone (MEK). The two strips are carefully folded (eight folds) as shown in FIG. 2, with the polarity-machine orientations of the strips in opposite directions. The two strips are placed into a vice with polycarbonate jaws. The vice is closed applying as much pressure as possible. The vice is placed in an oven and heated at 122° F. (50° C.) for ten hours to bond the silver ink layers. Without removing the pressure, the vice is removed from the oven and allowed to air cool to room temperature.

The bonded and annealed bender-element is removed from the vice. The bender-element is tested for continuity of the multimorph by applying a field on the bender-element and observing the deflection.

This example illustrates the method of fabricating the bender-elements of the present invention.

EXAMPLE II

Following the same procedure as set forth in Example I, the folded films are inserted into a vice where the jaws have been machined such that they have a curvature as illustrated in FIG. 3.

This example illustrates the method of fabricating the biased bender-elements of the present invention.

EXAMPLE III

A pair of bender-elements fabricated by the method of Example II are placed in juxtaposition to one another such that an applied field will cause the deflection to be in opposite directions. The ends of each biased bender-element is fixed to the corresponding ends with Scotch tape. An applied field causes the deflection of the pair of bender-elements as shown in FIG. 5.

This example illustrates the piezoelectric unit cell of the present invention.

The piezoelectric unit cells of the present invention have a wide potential of uses. The configuration of a pump 80 and the circuit diagram as illustrated in FIG. 9 is suited as a liquid cooling ventilation garment (LCVG) pump. In addition to the active thermal cooling application of the LCVG pump, piezoelectric pumps can act as electro-mechanical actuators. As an actuator, the piezoelectric pump may provide solutions to control problems in robotics, bioengineering, advanced remote control and telepresence technologies.

The piezoelectric electro-mechanical device of the present invention besides being used in a pump may be used as an actuator, such as any linear short stroke actuator, which may fill the demand for output devices that are more energy efficient, rugged, economical and easier to control than conventional actuators.

Figure 10:
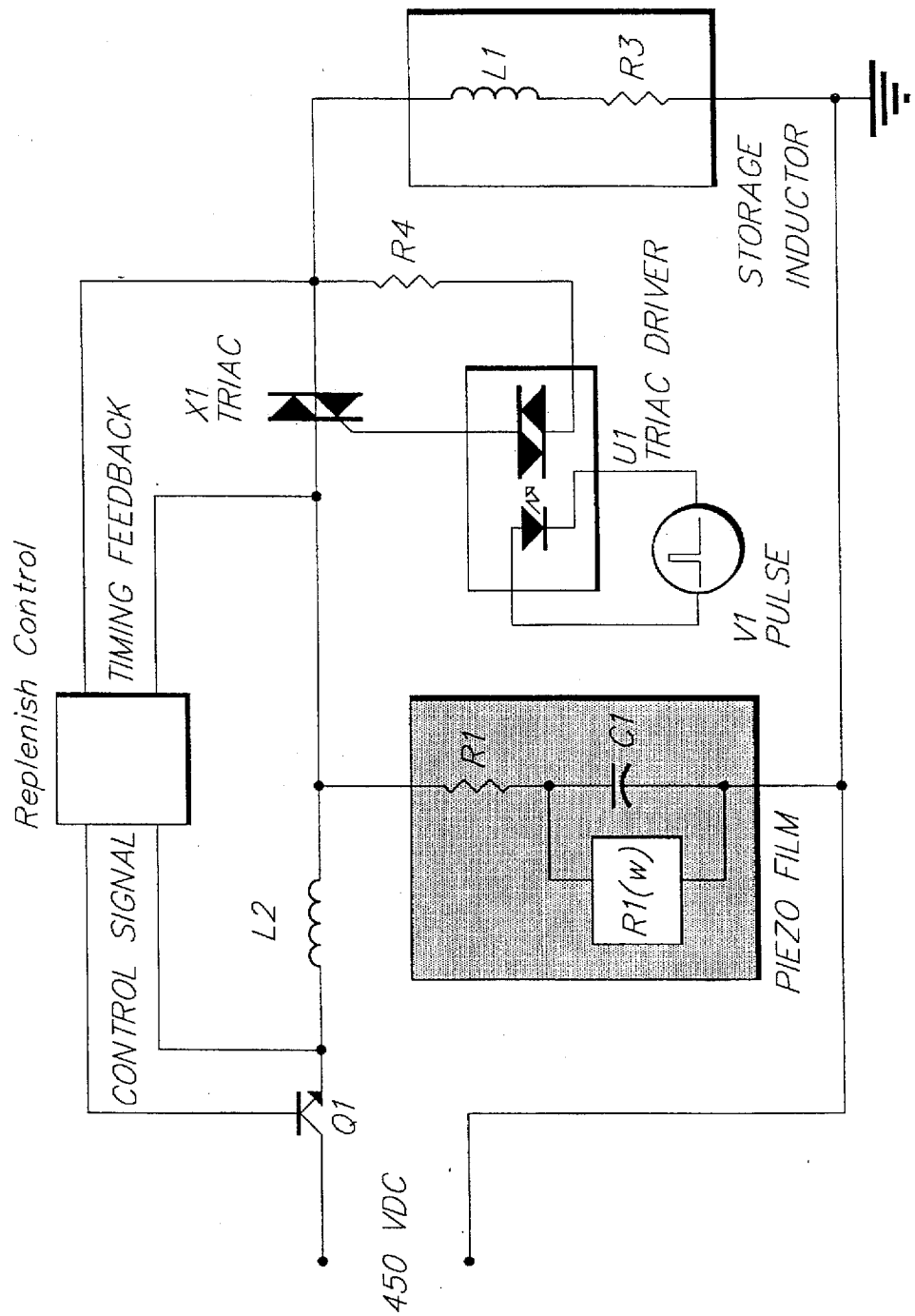
FIG. 10 is a schematic diagram of a unique circuit for powering the unit cells of the present invention.

The present invention also includes a unique circuit for the piezoelectric (piezo) film drive circuit shown in FIG. 10. The key to the circuit system lies in its ability to transfer energy from the charged piezo film, transfer the energy to an inductor and recharge the piezo film with the opposing polarity all at frequencies which provide the desired maximum energy to be applied to the film or more specifically the unit cell(s). The frequency is controlled by the use of a triac and triac driver in the circuit which will be explained in reference to FIG. 10. As mentioned hereinbefore, the piezo film (unit cell or cells) acts as a resistor and capacitor, shown as R1 and C1 in the circuit. A power source, illustrated as 450 volts DC, is used to initially charge the film. This is accomplished by the control circuit turning on Q1, or closing the circuit as illustrated, and allowing the piezo film to charge to 450 volts (v). The charge current, and hence the charge time, is controlled by cycling Q1 on and off (e.g. 2 kHz). The duty cycle is set so as not to exceed the maximum allowable current available from the power source. The inductance of L2 is used to reduce the initial spike in current during each recharge cycle as will be explained in more detail hereinafter.

Before explaining the further operation of the circuit, the circuits other components are a triac X1 which acts as a gate to a storage inductor, L1 and R3; a triac driver U1 operated by an opto-isolator with a pulse signal V1; and a replenish control.

With the piezo film charged, the oscillation is initiated. The timing pulses required to set the frequency are TTL level signals with a pulse width of 10 μs or less delivered at twice the desired drive frequency. The narrow pulse width is required so that the triac is allowed to turn off when the current in the inductor reaches zero. The control signal is represented as V1 in the schematic and supplies the drive current to the opto-isolator which, in turn, provides the switch on signal for the triac gate.

The first pulse occurs after Q1 is opened. When the first pulse occurs, the triac X1 is turned on and current begins to flow from the piezo film through the triac X1 and the main inductor L1.

As the current magnitude increases above the minimum hold current for the triac, the triac is latched on and will continue to conduct until the current drops below the minimum hold current (near zero), at which point triac X1 will switch off. The voltage present on the piezo film during this time from the triac being turned on to off has gone from a positive peak (+450 v) to a negative peak (near −450 v). The polarity reversal is provided by the inductor. The actual voltage of the negative peak is determined by the amount of energy lost in the inductor and piezo film during the cycle. With the triac X1 off, the piezo film will remain in its negatively charged state with only parasitic dielectric losses slowly reducing the voltage present on the piezo film.

The piezo film remains in this negatively charged state until a next (second) pulse from V1. The second pulse again turns on triac X1; however, the current flow and voltages will be reversed and the process is reversed. At the end of this cycle the piezo film is left positively charged (somewhat below +450 v) from its previous negatively charged state. Again, the actual positive peak voltage is determined by the amount of energy lost in the inductor and piezo film in the two cycles of the triac X1 being on and off.

If this process were allowed to continue, the voltages would continue to decay and the system would come to a halt after a number of cycles. In order to provide a continuous drive signal, the energy lost during each two pulse cycles must be replenished. This is accomplished by using the control circuit to turn on Q1 and using the power source to charge the piezo film to the positive peak (+450 v). The control circuit senses the large positive voltage which occurs at triac X1 to turn on Q1. The turn on of Q1 replenishs or energizes the circuit to maximum voltage and the turn off of Q1 is accomplished before the next (third) pulse from V1. The third pulse initiates the next cycle which is then repeated and repeated.

At a 60 Hz pulse drive rate, the period of the "hold time" is sufficiently long to allow the piezo film to be charged back to 450 v using relatively low charging currents. By charging only on the positive portion of the cycle, a slight DC offset will be induced; however, in general it will be a small percentage of the drive voltage and should not effect the operation of the piezo film.

This unique circuit has the capability of powering any capacitive device which requires the voltage of the device to alternate polarity (positive to negative) while recovering the charging energy and at controlled frequencies. This use of a triac is different than in applications where it is normally used.

Figure 11:
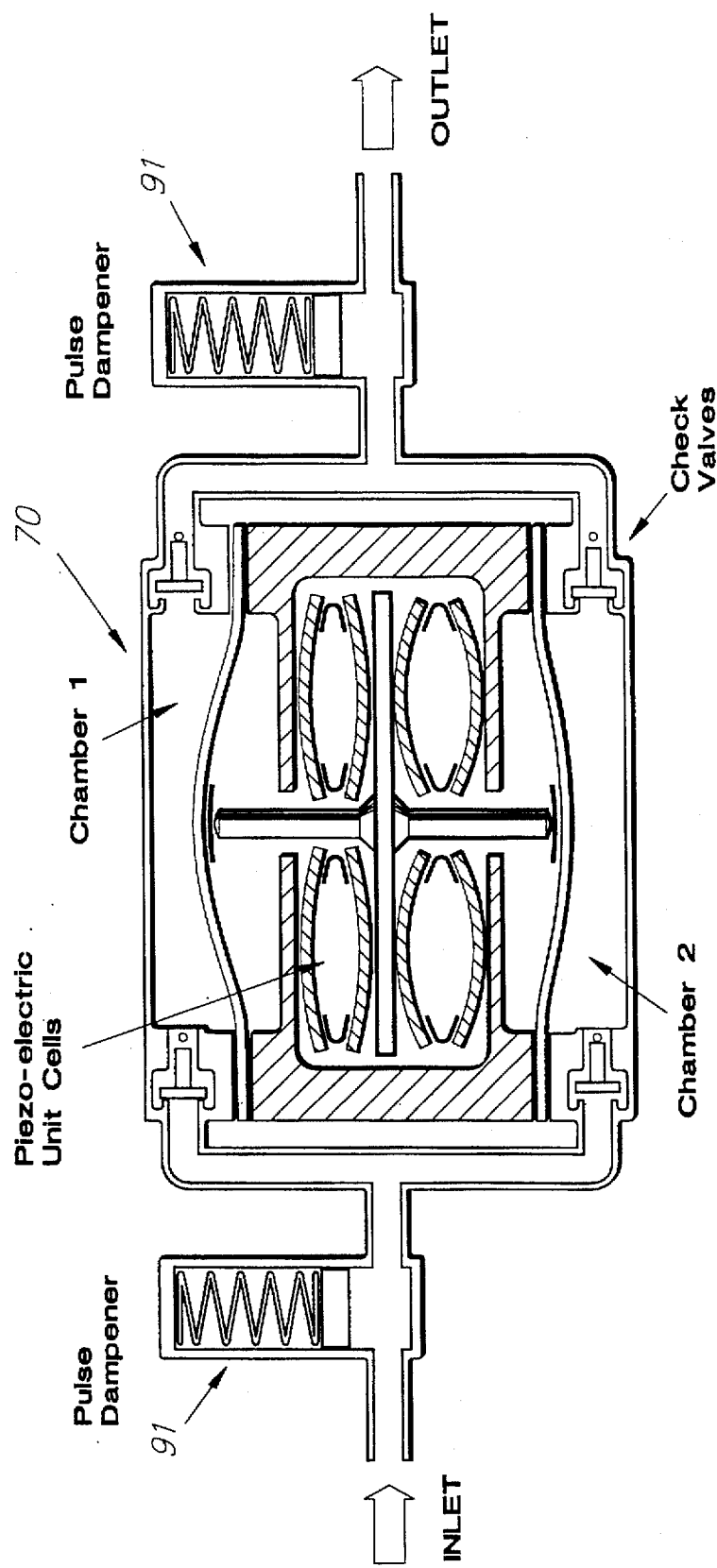
FIG. 11 is a schematic view which illustrates a piezoelectric pump with parallel multi unit cells activating push-pull pistons of a piezoelectric pump with double parallel chambers and inlet and outlet pulse dampers.

While the configuration of the pumps illustrated herein above are characterized as diaphram pumps or double action piston pumps, the versatility of the piezoelectric unit cells of the present invention are illustrated in piezoelectric peristaltic pumps and centrifugal pumps. Further, the specific pump structure may be modified for specific applications. For example, referring to FIG. 11, double-acting diaphram pump 70 is shown with an inlet pulse dampener 90 and an outlet dampener 91. These dampeners are essential to allow the pump 70 to operate between a relatively uniform pressure difference if it is to operate well at resonance. Flow rates and pressures of piezoelelectric pumps are limited only by the size which can be economically made. Small pumps which operate in the 0–50 psi and 0–5 gpm (gallons per minute) range are normal.

Figure 12:
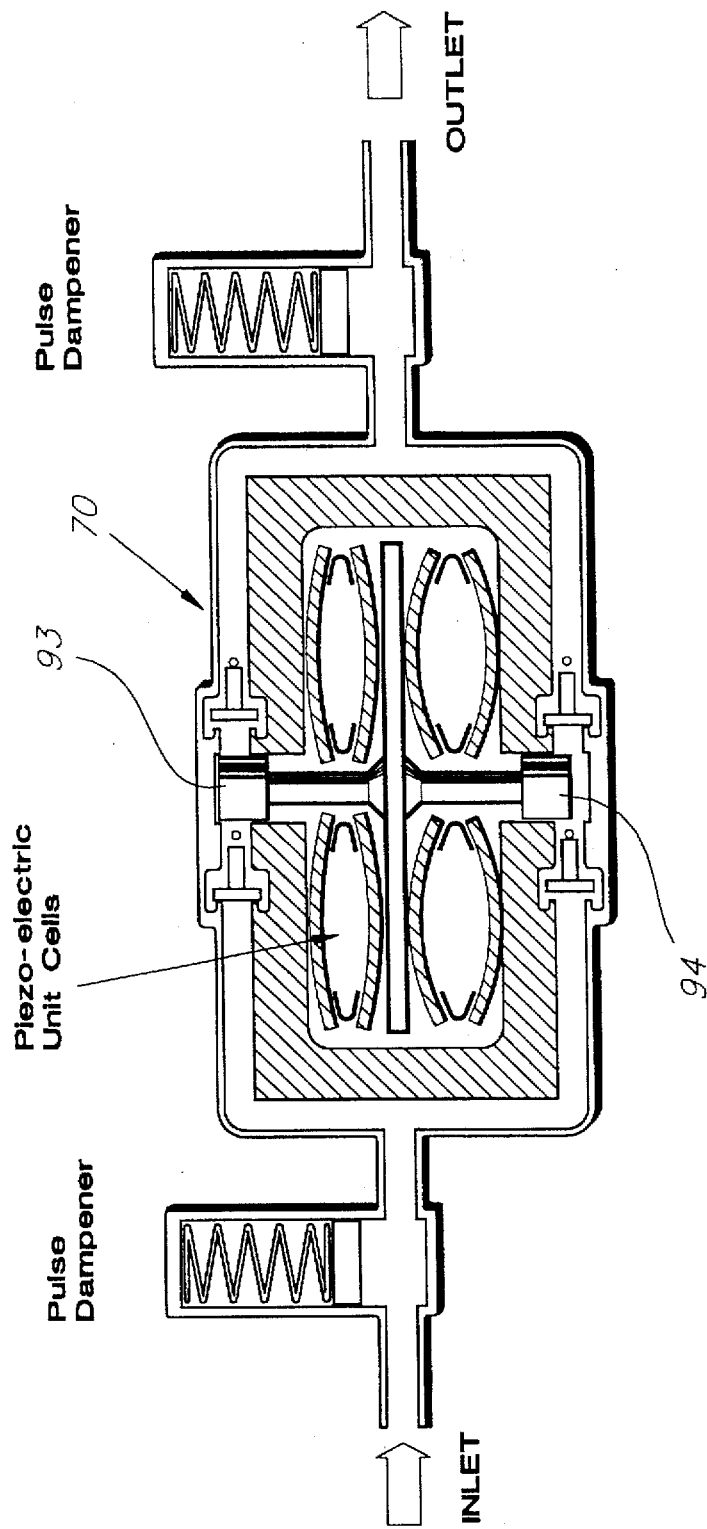
FIG. 12 is a schematic view of a piezoelectric pump with push-pull pistons in double parallel cylinders and inlet and outlet pulse dampers.

Referring to FIG. 12, the configuration of the fluid chambers are cylinders 93 and 94 respectively. This pump is essentially a positive displacement pump.

Figure 13A:
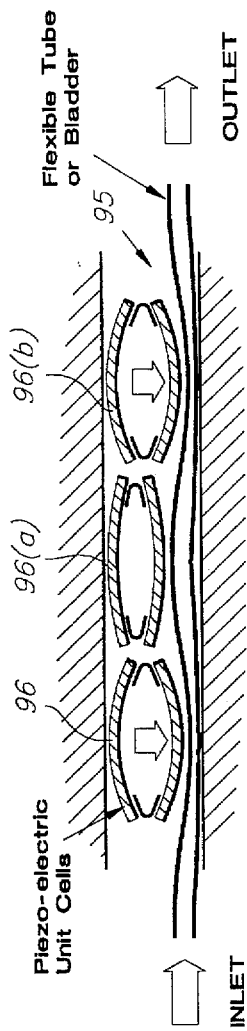
FIG. 13(a) and 13(b) shows the cyclic activation of the three piezoelectric unit cells to maintain positive flow.
Figure 13B:
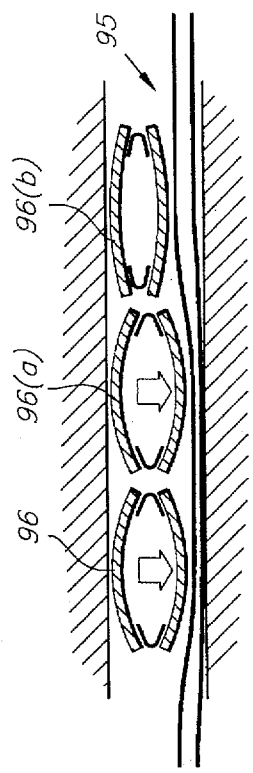
Figure 13:
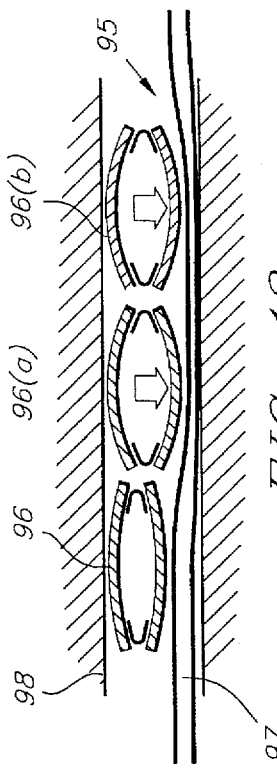
FIG. 13 is a schematic view of a peristalic pump with three multi cells activating the fluid flow through a flexible tubing.

Referring to FIG. 13, a peristaltic pump 95 has three piezoelectic unit cells 96, 96(a) and 96(b). A flexible tubing or bladder 97 carries the fluid being pumped. The tubing 97 is within a larger tubing or chamber having surfaces 98 and 99. A unit cell 96, not electrically activated and the tubing 97 fit between the surfaces 98 and 99 without compressing the flexible tube 97. In the operation of the pump, the unit cells 96, 96(a) and 96(b) are operated sequentially in an alternating mode of negative (contracted position) and positive (expanded position). At the beginning of each cycle unit cell 96 is in the negative mode whereas unit cells 96(a) and 96(b) are in the positive mode such as shown in FIG. 13. Thereafter, unit cell 96 is switched positive and unit cell 96(a) is switched negative as shown in FIG. 13(a). Still further, unit cell 96(a) is switched positive and unit cell 96(b) is switched negative as shown in FIG. 13 (b). This cycle is repeated to operate the pump 95. It is noted in this pump configuration that the unit cells 96, 96(a) and 96(b) each provide direct force and not indirect force as through a piston.

Figure 14:
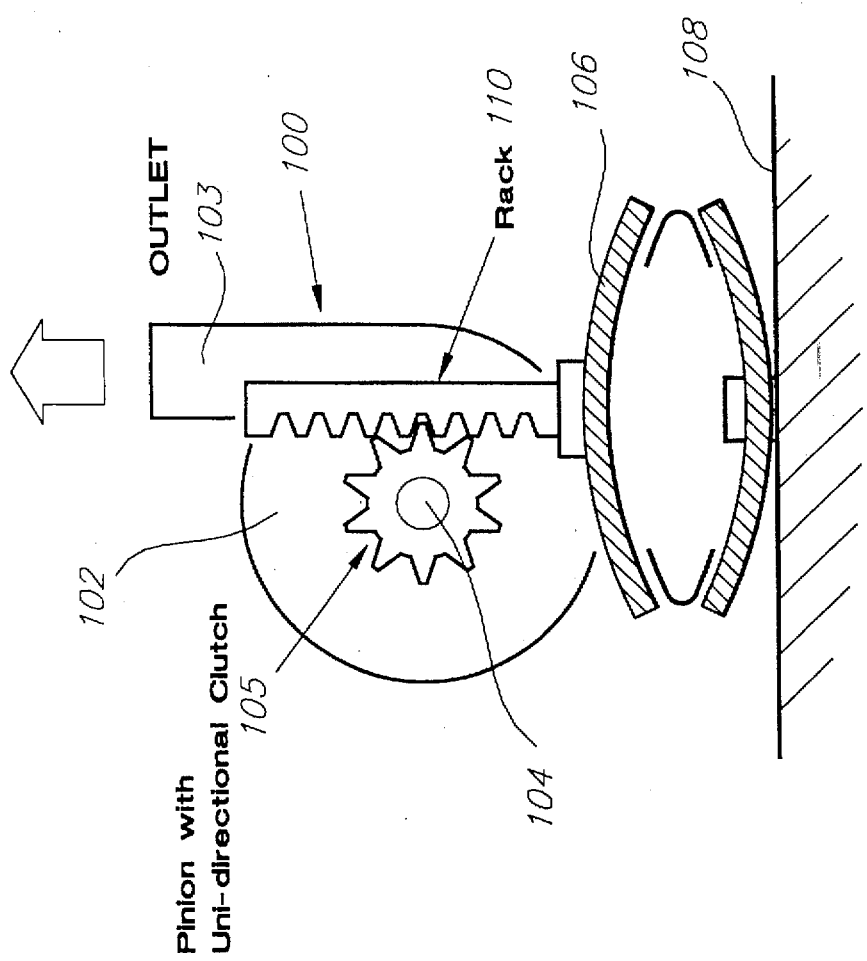
FIG. 14 is a schematic view of a piezoelectrically driven centrifugal pump.

Referring to FIG. 14, the piezoelectric cell may be used to power a force actuator where the force actuator is illustrated by a rack and pinion. Centrifugal pump 100 has a centrifugal pump head 102 with an outlet 103. The inlet is opposite the drive mechanism of pump 100. The pump 100 has a drive shaft 104 which is attached to the impeller in the pump head 102. Between the outside surface of pump head 102 and the pinion 105 on the drive shaft 104 is a unidirectional clutch (not shown). A piezoelectric unit cell 106 is affixed to a surface 108. On top of the unit cell 106 is a rack 110. In the operation of the pump 100, the expansion of the unit cell 106 moves the rack 110 upwards rotating the pinion 106 counterclockwise and rotates the drive shaft 104. When the unit cell 106 moves to its normal state, rack 110 moves downward and pinion 105 rotates clockwise but drive shaft 104 does not rotate since the clutch is not engaged. These examples of different types of pumps illustrate the versatality of the kinds of pumps which are available and the various operations of the unit cells of the present invention. The pumps may have applications as a heart pump, metering pump for medications or numerous other applications.

I claim:

1. A method for the fabrication of piezoelectric bender-elements which comprises:
   positioning a first piezoelectric film having a layer consisting essentially of a silver electrode coating applied to each side folded in a plurality of layers in a press;

positioning a second piezoelectric film having a layer consisting essentially of a silver electrode coating applied to each side folded in a plurality of layers on top of said first film, said second folded piezoelectric film having the polarity-machine orientation of said film 180° from that of said first film with respect to an applied voltage; and applying pressure to said folded piezoelectric films to compress the films, heating said compressed films while maintaining said films in compression and cooling said compressed and heated films to bond and anneal said films.

2. A method according to claim 1 wherein said piezoelectric film is polyvinylidene fluoride.

3. A method according to claim 1 wherein said pressure applied is between 100 psi and 10,000 psi.

4. A method according to claim 1 wherein said heating is at temperatures between 35° C. and 650° C.

5. A method according to claim 4 wherein the time of heating is between 12 hours and 30 minutes, said time being shorter at said higher temperature.

6. A method according to claim 1 wherein said thin layer of silver electrode coating does not touch the edges of said film.

7. A method for fabricating a biased piezoelectric bender-element according to claim 1 wherein said press imparts a radius of curvature to said bender-element.

8. A method according to claim 1 wherein the appropriate number of layers are in said second film as in said first film in said press.

9. A method according to claim 1 wherein a tab of film extends from each said film and an electrical lead is attached to said tabs.

10. A method according to claim 1 wherein a tab of film extends from each said film and is folded to be positioned to be placed in the fold above said tab to provide electrical continuity of said film of silver electrode coating.

11. A method for the fabrication of piezoelectric bender-elements which comprises:

positioning a first plurality of layers of piezoelectric material having a thin layer of an electrode coating applied to each side in a press with the orientation of each said layer of material the same as a single folded film;

positioning a second plurality of layers of piezoelectric material on top of said first plurality of layers, said second layers of material having a thin layer of an electrode coating applied to each side and with the orientation of each said layer of material the same as a single folded film, said second plurality of layers of piezoelectric material oriented such that the polarity-machine orientation of said material is 180° from that of said first plurality of layers of material with respect to an applied voltage; and applying pressure to said layers of piezoelectric material to compress said layers of material, heating said compressed layers while maintaining said layers of material in compression and cooling said compressed and heated films to bond and anneal said layers of material.

12. A method for fabricating a mechanically biased piezoelectric bender-element according to claim 11 wherein said press imparts a radius of curvature to said bender-element.

13. A method according to claim 11 wherein the appropriate number of layers are in said second layers of material as in said first layers of material in said press.

14. A method according to claim 11 wherein a tab of electrode coated material extends from each said layer of material and is folded to be positioned to be placed in the fold above said tab to provide electrical continuity of said film of electrode coating.

* * * * *